United States Patent
Tseng (10) Patent No.: US 11,338,472 B2
(45) Date of Patent: *May 24, 2022

(54) CUTTING APPARATUS WITH AUTO CHUCK CLEANING MECHANISM

(71) Applicant: Taiwan Semiconductor Manufacturing Co., Ltd., Hsinchu (TW)

(72) Inventor: Chih-Min Tseng, Jhudong Township, Hsinchu County (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 164 days.

This patent is subject to a terminal disclaimer.

(21) Appl. No.: 16/901,234

(22) Filed: Jun. 15, 2020

(65) Prior Publication Data

US 2020/0307022 A1   Oct. 1, 2020

Related U.S. Application Data

(63) Continuation of application No. 16/135,095, filed on Sep. 19, 2018, now Pat. No. 10,695,952.

(51) Int. Cl.
*B28D 5/00* (2006.01)
*H01L 21/687* (2006.01)
*H01L 21/683* (2006.01)
*H01L 21/82* (2006.01)

(52) U.S. Cl.
CPC ......... *B28D 5/0076* (2013.01); *B28D 5/0094* (2013.01); *H01L 21/6836* (2013.01); *H01L 21/68707* (2013.01); *H01L 21/82* (2013.01)

(58) Field of Classification Search
CPC . B28D 5/0076; B28D 5/0094; H01L 21/3836; H01L 21/68707; H01L 21/82; B08B 1/005; B08B 1/008
USPC ............................. 15/88.4, 93.1, 256.5, 246
See application file for complete search history.

(56) References Cited

U.S. PATENT DOCUMENTS

| | | | | |
|---|---|---|---|---|
| 2,354,586 A | * | 7/1944 | Fischeralbertc .... | E04F 21/0038 404/74 |
| 3,102,290 A | * | 9/1963 | Sannes .................... | A22C 17/08 15/3.17 |
| 4,972,630 A | * | 11/1990 | Seki .......................... | B24B 7/06 15/77 |
| 7,364,616 B2 | * | 4/2008 | Tsuchiya ........... | H01L 21/67092 117/2 |

(Continued)

*Primary Examiner* — Evan H MacFarlane
*Assistant Examiner* — Liang Dong
(74) *Attorney, Agent, or Firm* — McClure, Qualey & Rodack, LLP (57) ABSTRACT

A cutting apparatus is provided. The cutting apparatus includes a processing chamber, a chuck table, a transferring mechanism, and a cleaning member. The chuck table is disposed in the processing chamber and configured to hold a workpiece on a chuck surface of the chuck table during a cutting process. The transferring mechanism is configured to transfer the workpiece to the chuck surface before the cutting process or transfer the workpiece away from the chuck surface after the cutting process. The cleaning member is disposed in the processing chamber, and is configured to move across and clean the chuck surface, driven by the transferring mechanism.

20 Claims, 11 Drawing Sheets

(56) References Cited

U.S. PATENT DOCUMENTS

2005/0007571 A1* 1/2005 Yamamoto ............ G03B 27/52
355/30

* cited by examiner

CUTTING APPARATUS WITH AUTO CHUCK CLEANING MECHANISM

CROSS REFERENCE TO RELATED APPLICATIONS

This application is a Continuation application of U.S. patent application Ser. No. 16/135,095, filed on Sep. 19, 2018, the entire of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

Integrated circuits (ICs) are fabricated on semiconductor wafers, and each wafer typically contains hundreds or thousands of individual integrated circuits, depending on the size of the wafer and the size of the individual integrated circuits. Between the integrated circuits are spaces, known as "cutting grooves (or scribe lines)", which separate the individual integrated circuits on the wafer. In a process known as "cutting", wafers are cut along the cutting grooves to form separate integrated circuits, known as "dies".

Although existing cutting apparatuses and methods have been generally adequate for their intended purposes, they have not been entirely satisfactory in all respects.

BRIEF DESCRIPTION OF THE DRAWINGS

For a more complete understanding of the present disclosure, and the advantages of the present disclosure, reference is now made to the following descriptions taken in conjunction with the accompanying drawings, in which.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Various features may be arbitrarily drawn in different scales for the sake of simplicity and clarity.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of a cutting apparatus for performing a cutting process on a workpiece are provided. The cutting process is performed with a cutting assembly of the cutting apparatus to cut a workpiece, such as a semiconductor wafer, into small dies each containing a circuit pattern fabricated by various processes, such as lithography, etching, etc.

Figure 1:
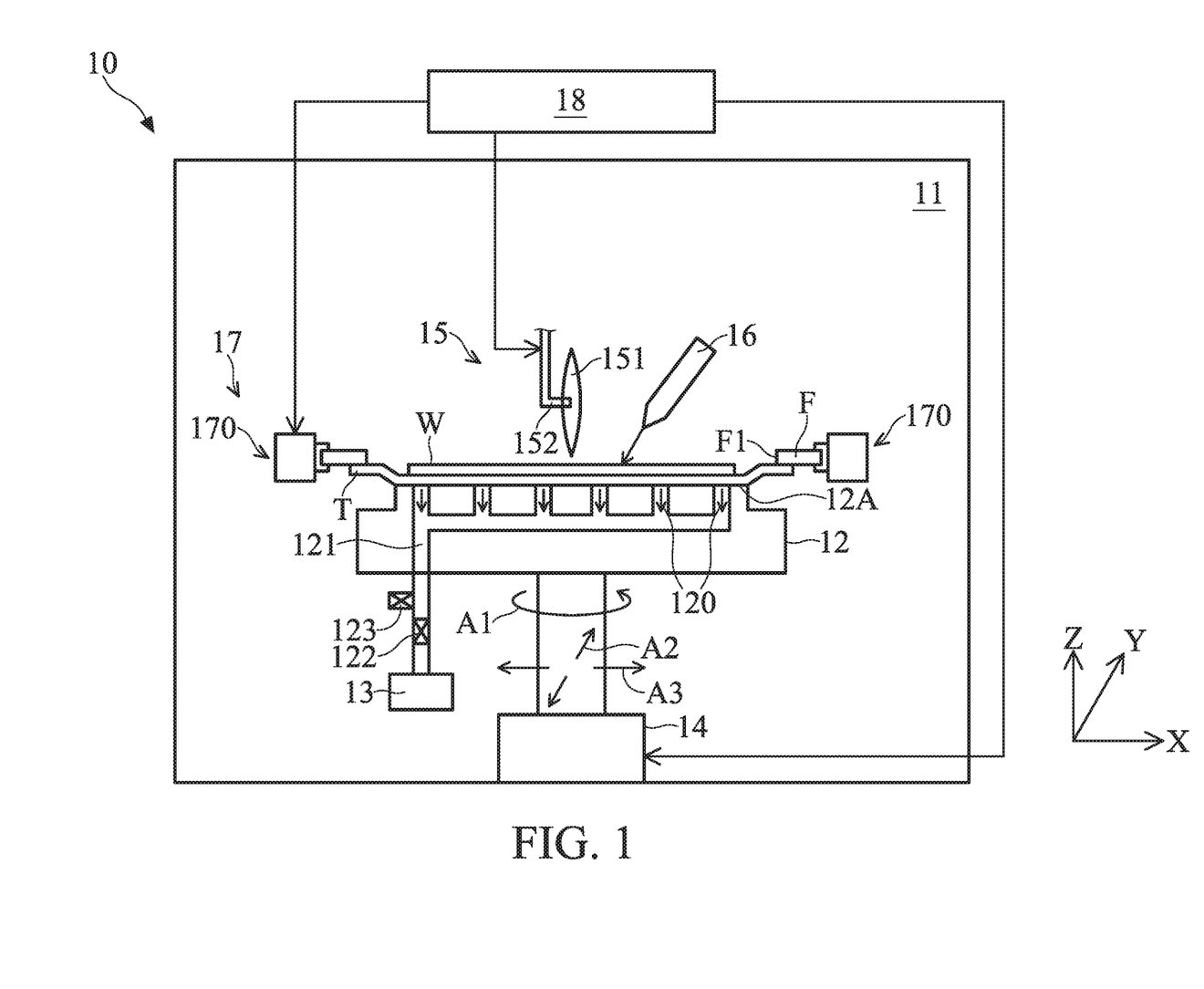
FIG. 1 schematically shows a cutting apparatus, in accordance with some embodiments.

FIG. 1 schematically shows partial elements of a cutting apparatus 10 in accordance with some embodiments. The cutting apparatus 10 includes a processing chamber 11 where the cutting process is performed.

A chuck table 12 is disposed in the processing chamber 11, configured to support, hold, and position a workpiece W during the cutting process. In some embodiments, the chuck table 12 can clamp the workpiece W by vacuum force. For example, the chuck table 12 includes a flat chuck surface 12A (see FIG. 1) on which the workpiece W may be supported. The chuck surface 12A forms a number of ports 120 (see also FIG. 5) at which a pressure differential, relative to the ambient pressure around the chuck table 12, is used to hold the workpiece W against the chuck surface 12A. The ports 120 are connected to a vacuum pump 13, for example via a passage 121. The passage 121 preferably includes a check valve 122 which connects and disconnects the vacuum pump 13 to the passage 121 and the ports 120. The check valve 122 is opened when the vacuum pump 13 is running, and is closed, to maintain a vacuum within the passage 121 and the ports 120, when the vacuum pump 13 is turned off.

In some embodiments, a relief valve 123 is attached to or located within the passage 121, as shown in FIG. 1. When opened, the relief valve 123 equalizes the pressure differential between the passage 121 and ports 120 and the ambient pressure around the chuck table 12, in order to facilitate easier removal of the workpiece W from the chuck surface 12A. As an alternative to the relief valve 123, the vacuum pump 13 may be run in reverse to re-pressurize the passage 121 and the ports 120, or leakage may be allowed to slowly re-pressurize the passage 121 and the ports 120 over time.

In some other embodiments, the chuck table 12 may also be another holding device that can clamp the workpiece W on its flat chuck surface 12A by an alternative force or mechanism other than the vacuum force described above. In some embodiments, the chuck table 12 includes metal or ceramic material.

Figure 2:
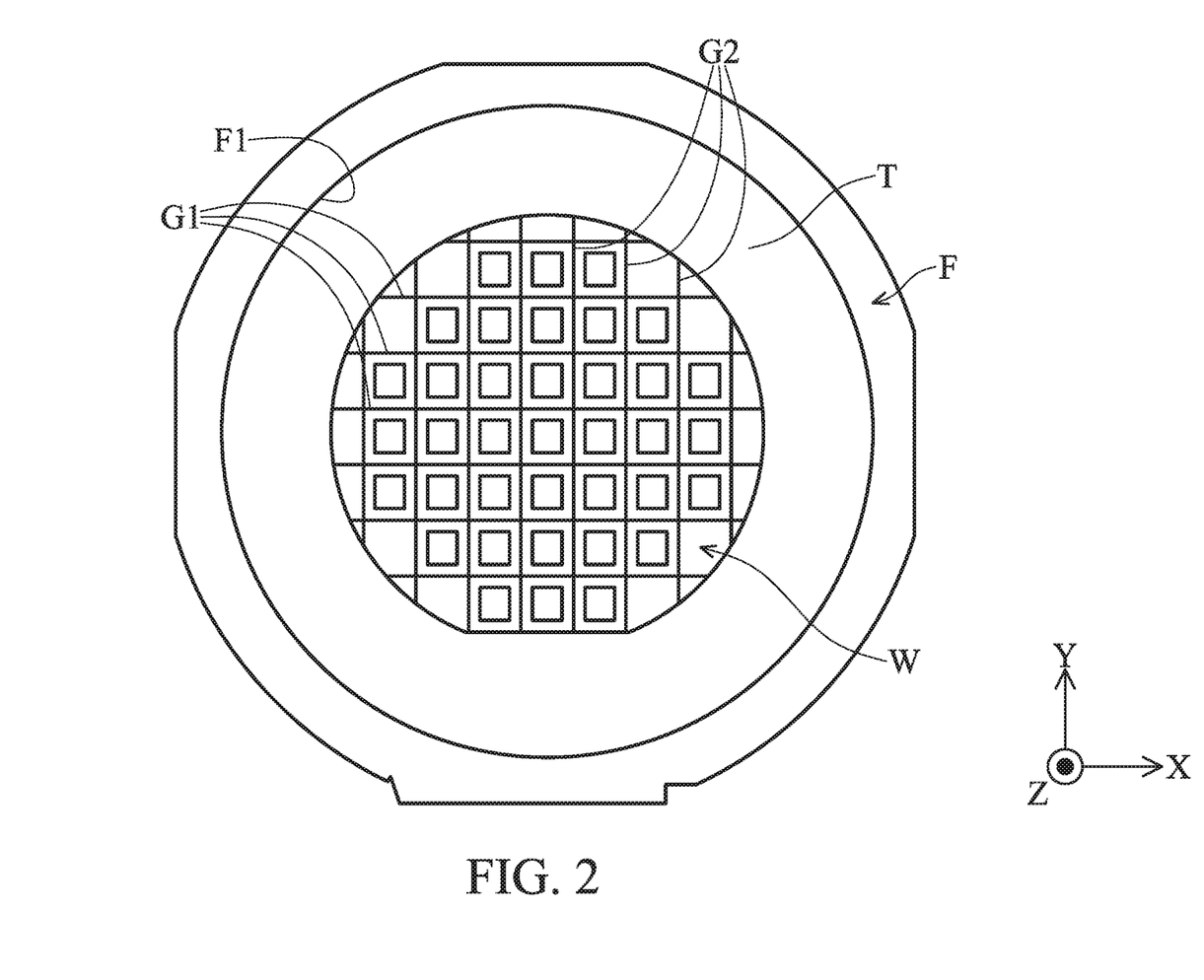
FIG. 2 is a plain view of a workpiece-and-frame combination, in accordance with some embodiments.

The workpiece W to be diced may have crosswise cutting grooves formed on its front surface. In some embodiments, the cutting grooves are arranged at regular intervals in the form of lattice to define a lot of rectangular dies each having a circuit pattern formed therein. For example, as shown in FIG. 2, on the workpiece W (e.g., a semiconductor wafer), cutting grooves G1 and G2 are formed in two directions perpendicular to each other (such as an X-direction and a Y-direction in FIG. 2), and the cutting grooves G1 or G2 parallel to one another are equidistantly positioned. The cutting grooves G1 and G2 are in positions along the scribe lines that are predefined in the previous processes. In other some embodiments, the workpiece W may have different cutting groove patterns.

Referring to FIG. 1, a cutting assembly 15 is disposed in the processing chamber 11, configured to cut along the cutting grooves, such as the cutting grooves G1 or G2 in FIG. 2, on the workpiece W to form a number of individual dies, during the cutting process. In some embodiments, the cutting assembly 15 may include a circular cutting blade 151. The cutting blade 151 is set to correspond to the center of the chuck table 12. During the cutting process, the cutting blade 151 is operable to rotate at high speeds, such as between about 30,000 and about 60,000 revolutions per minute, on a spindle 152 and to contact the front surface of the workpiece W. The cutting assembly 15 may be powered in a variety of manners including via electric or pneumatic motors (not shown). In some embodiments, the cutting blade 151 is nickel-plated with a diamond grit cutting edge to ensure smooth, clean cuts, with minimal fraying and splintering. In some embodiments, the cutting blade 151 is about one mil (i.e., about 25.4 m) thick.

The chuck table 12 with the workpiece W thereon can also be moved by a driving mechanism 14 (see FIG. 1) during the cutting process. In some embodiments, the driving mechanism 14 may rotate the chuck table 12 through an angle A1 and/or the driving mechanism 14 may move the chuck table 12 laterally A2 and A3 in two perpendicular directions (such as the Y-direction and X-direction illustrated in FIG. 1) relative to the cutting assembly 15 to cut the workpiece W into separate dies using the cutting assembly 15. For example, the driving mechanism 14 may drive the chuck table 12 to move in the Y-direction to bring the workpiece W under an alignment unit (not shown), and then, a selected cutting groove on the workpiece W is put in alignment with the cutting blade 151. When the chuck table 12 is moved in the Y-direction, the workpiece W is cut along the selected cutting groove with the cutting blade 151 that is rotating at a high speed. Every time the workpiece W has been cut along the selected cutting groove, the workpiece W is shifted a distance that is equal to the groove-to-groove interval in the X-direction (by the driving mechanism 14), and the chuck table 12 is moved back and forth repeatedly in the Y-direction so that the workpiece W may be cut sequentially along the cutting grooves in one direction.

After the workpiece W has been cut along all cutting grooves in one direction, the chuck table 12 is rotated 90 degrees by the driving mechanism 14, and then, the same cutting procedure described above is repeated to cut the workpiece W along all cutting grooves in the other direction. Accordingly, the workpiece W is cut into small singulated dies (i.e., the cutting process).

Operation of the cutting blade 151 generates a considerable amount of heat, which can damage the dies if not appropriately dissipated. Thus, in some embodiments, the cutting blade 151 may be cooled by water (e.g., deionized (DI) water) ejected from a water dispensing device, such as a jet nozzle device 16. The water may be applied additionally to cool and cleanse the workpiece W and associated singulated dies during the cutting process.

In addition, the workpiece W to be diced may be attached to an associate frame F with an adhesive tape T to form a workpiece-and-frame combination (see FIG. 1 and FIG. 2) for ease of use in the cutting apparatus 10. The use of the frame F and adhesive tape T is to maintain the singulated dies of the workpiece W in place during the cutting process and to facilitate easier and more efficient transportation of the workpiece W and associated dies in the cutting apparatus 10 (through a transferring mechanism 17 (FIG. 1) which will be described later) before or after the cutting process.

In some embodiments, the frame F has a flat ring structure with an opening μl which is larger than the workpiece W. The adhesive tape T has an adhesive coating on its one side (such as the upper side depicted in the figures) and is attached to the lower surface of the frame F and stretched across the opening F 1. The workpiece W is secured to the adhesive tape T within the opening F 1. Accordingly, the workpiece W and the adhesive tape T underneath the workpiece W can be secured on the chuck surface 12A of the chuck table 12 (see FIG. 1), for example by vacuum force, during the cutting process.

In some embodiments, the adhesive tape T is a pressure sensitive adhesive tape which is designed to exhibit the temporary bonding desirable for use in the semiconductor wafer cutting process. For example, the adhesion level of such tapes can be tailored to provide sufficient bonding strength so that the wafer can be securely held in position during dicing and water cleaning of the wafer.

In some embodiments, the pressure sensitive adhesive tape includes a backing film and a pressure sensitive adhesive layer (coating). The backing film may include a polymeric material or a blend of polymeric materials. Such materials may include, but are not limited to, polyethylene, polypropylene, polyvinyl chloride, polyvinylidene chloride, polyester, polyamide, polyurethane, polyether, polycarbonate, polysulfone, polyketone, polyetherketone, polyimide, copolymers of styrene-diene, copolymer of butylenes terephthalate-ether, and natural or synthetic rubbers. Alternative backing materials that can be used include foam, metal foil, and paper. In general, expandable backing films which exhibit good heat resistance are preferred. In some embodiments, the backing film may have a thickness of from about 0.1 to about 5 millimeters, from about 0.5 to about 1.0 millimeter in some other embodiments.

In some embodiments, the pressure sensitive adhesive layer of the pressure sensitive adhesive tape includes a pressure sensitive adhesive, at least one multifunctional monomeric or oligomeric component, and/or at least one free radical initiator, and optionally, a crosslinking agent. The pressure sensitive adhesive or adhesive blend may comprise, for example, tackified natural rubbers, synthetic rubbers, tackified styrene block copolymers, polyvinyl ethers, acrylic adhesives, poly-alpha-olefins and silicone adhesives, as well as blends thereof. In some embodiments, the acrylic adhesives are polymers or copolymers of acrylic acid, t-butylmethacrylate, butyl acrylate, 2-ethyl-hexylacrylate, glycidyl methacrylate, hydroxyethylacrylate, N-methylol acrylamide, isobornyl methacrylate, N-vinylpyrrolidone or vinyl acetate. The multifunctional vinyl monomeric or oligomeric component may include, but is not limited to, vinyl ethers, styrenic monomers, diene monomers, acrylates and methacrylates.

Before loaded into the processing chamber 11, a number of workpiece-and-frame combinations described above may be contained in a cassette (not shown) placed at a load port (not shown) of the cutting apparatus 10 (see FIG. 1). The workpiece-and-frame combination is then transported one by one from the cassette by the transferring mechanism 17 in the processing chamber 11 to the chuck table 12 for the cutting process, and after the cutting process, the workpiece-and-frame combination is transported by the transferring mechanism 17 back to the cassette that is to be transferred to the next processing station (e.g., a die picking-up station).

Referring to FIG. 1, the transferring mechanism 17 may include a pair of parallel linear driving assemblies 170. In some embodiments, the linear driving assemblies 170 are arranged slightly above the chuck table 12, and the chuck table 12 is positioned on the extending path (e.g., along the Y-direction) of the linear driving assemblies 170 and between the linear driving assemblies 170.

Figure 3A:
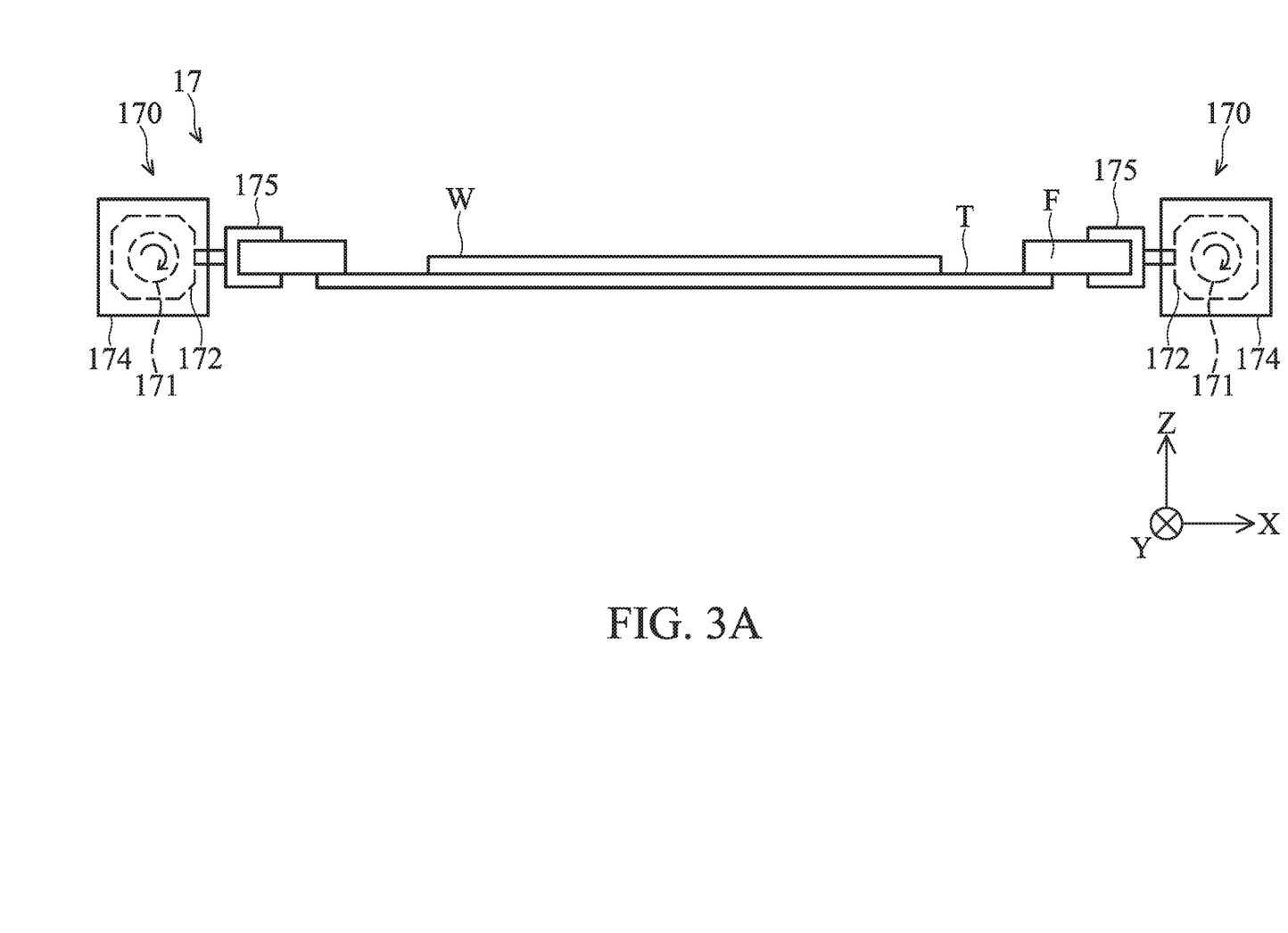
FIG. 3A is a side view illustrating the connection between a transferring mechanism and a workpiece-and-frame combination and the internal configuration of the transferring mechanism, in accordance with some embodiments.
Figure 3B:
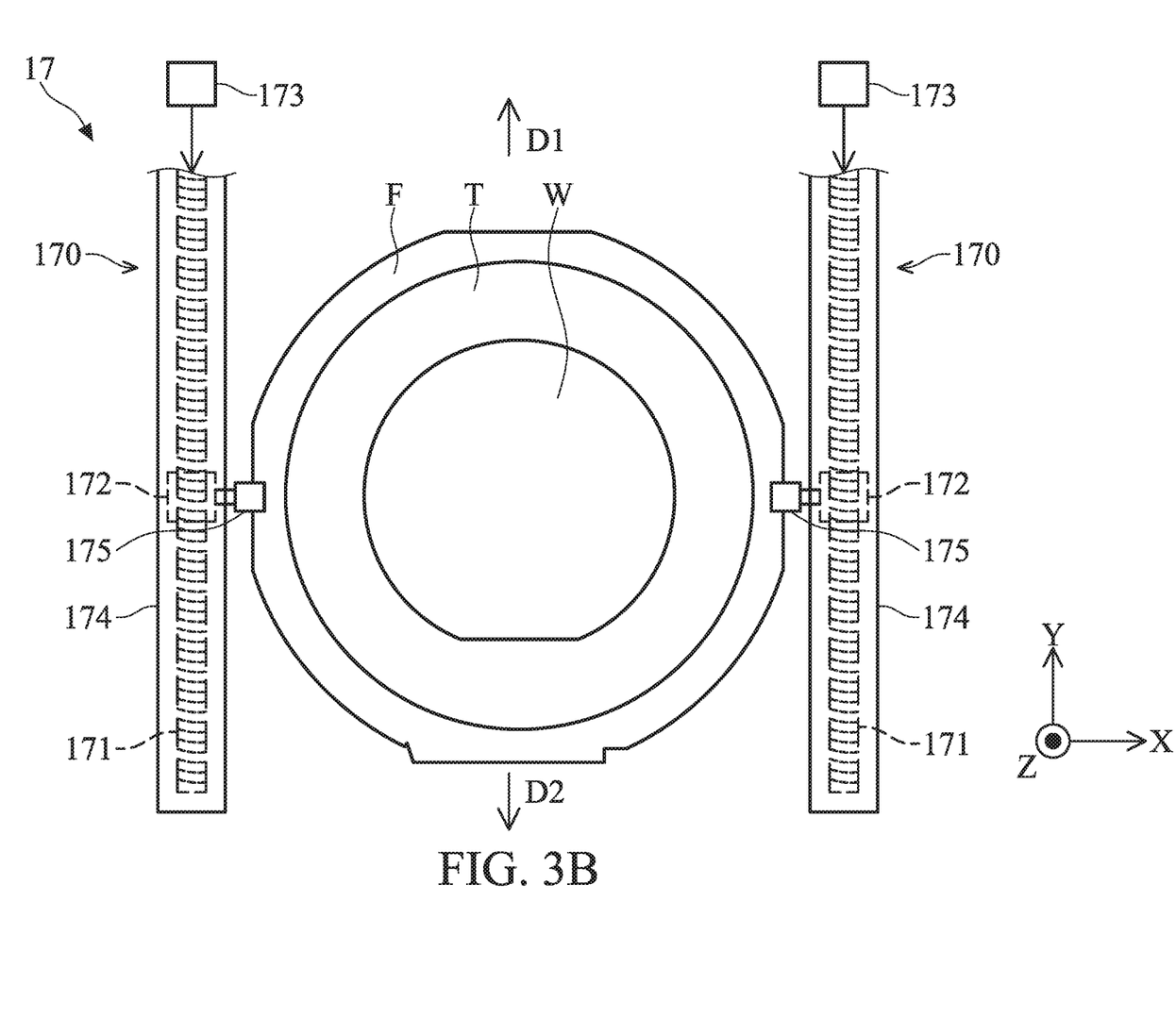
FIG. 3B is a top view illustrating the connection between a transferring mechanism and a workpiece-and-frame combination and the internal configuration of the transferring mechanism, in accordance with some embodiments.

FIG. 3A and FIG. 3B are respectively a side view and a top view illustrating the connection between a transferring mechanism 17 and a workpiece-and-frame combination and the internal configuration (depicted in dashed lines) of the transferring mechanism 17, in accordance with some embodiments. As shown, the linear driving assemblies 170 of the transferring mechanism 17 have the same structural configuration. Each linear driving assembly 170 includes a screw 171, a nut 172, and a driving motor 173 (see FIG. 3B). The screw 171 and the nut 172 may be threaded and coupled together to form a lead screw or a ball screw that can convert the rotational movement of the screw 171 into linear movement of the nut 172 along the extending direction of the screw 171 (e.g., parallel the Y-direction). The driving motor 173 is configured to rotate the screw 171 clockwise or counterclockwise, to move the nut 172 linearly along the screw 171 in a first direction D1 or a second direction D2 opposite to the first direction D1.

In some embodiments, each linear driving assembly 170 may further include a housing 174 for receiving the screw 171 and nut 172 and protecting these components from the wet environment of the processing chamber 11. In addition, the nut 172 may include or be attached to a gripper 175 (see FIGS. 3A and 3B) that extends outside the housing 174 to fixedly connect and grip one edge of the frame F of a workpiece-and-frame combination during transportation of the workpiece-and-frame combination in the processing chamber 11. In some alternative embodiments, the housing 174 and the gripper 175 may also be omitted, and the nut 172 has a gripping recess that can fixedly engage with the frame F of a workpiece-and-frame combination.

Accordingly, while the pair of parallel linear driving assemblies 170 is synchronously operated, a workpiece W to be diced (in a workpiece-and-frame combination) is driven in the first direction D1 to the chuck table 12 to perform the cutting process. It should be noted that the frame F of a workpiece-and-frame combination is fixedly held on the transferring mechanism 17 and does not come into the chuck surface 12A when the workpiece W and the underlying adhesive tape T are attracted to the chuck surface 12A (see FIG. 1). Moreover, after the cutting process, the pair of parallel linear driving assemblies 170 can be synchronously operated to drive the diced workpiece W in the second direction D2 away from the chuck table 12 and back to the cassette staying at the load port of the cutting apparatus 10.

It should be understood that some components related to the lead screw or ball screw are not depicted in the figures and are not further described herein for the sake of simplicity and clarity. In addition, in some embodiments, each linear driving assembly 170 of the transferring mechanism 17 may also be another type of linear driving assembly (e.g., a linear electromagnetic actuator).

In some embodiments, all operations (such as the operations of the transferring mechanism 17, the cutting assembly 15, the driving mechanism 14, etc.) of the cutting apparatus 10 described above may be controlled by a controller 18. In some embodiments, the controller 18 can be a computer device including a processing unit and a memory unit. The processing unit can be implemented in numerous ways, such as with dedicated hardware, or with general-purpose hardware (e.g., a single processor, multiple processors or graphics processing units capable of parallel computations, etc.) that is programmed using microcode or software instructions to perform the functions recited herein.

Figure 4:
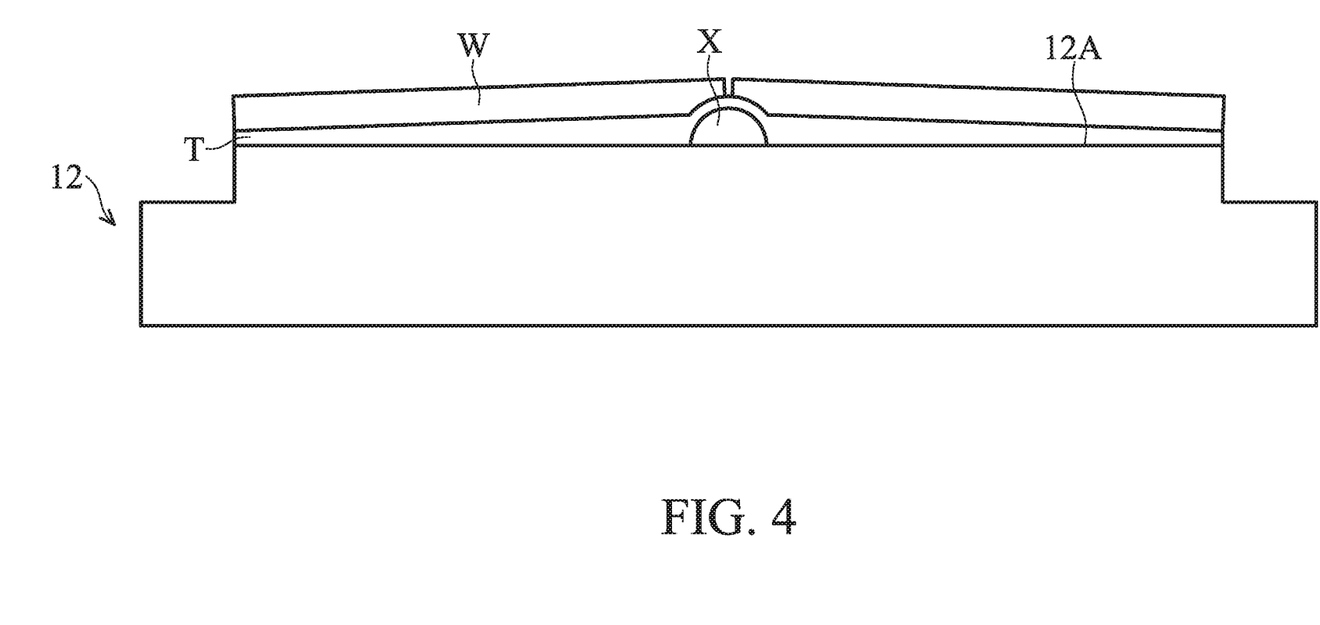
FIG. 4 schematically shows that debris on the chuck surface can cause cracks in the workpiece during the cutting process.

It is also found that debris or other foreign material generated during the cutting process may splash randomly in the processing chamber 11 and may stain the chuck surface 12A of the chuck table 12. Referring to FIG. 4, once the debris X appears between the workpiece W and the chuck surface 12A, it may cause internal stress on the workpiece W or cracks in the workpiece W during the cutting process. Thus, the yield rate of the cutting process is reduced.

In order to improve the cleanliness of the chuck surface 12A during the cutting process, the following embodiments of the cutting apparatus 10 further introduce various auto cleaning mechanisms into the processing chamber 11 for cleaning the chuck surface 12A before a workpiece W is placed on the chuck surface 12A and/or after the diced workpiece is removed from the chuck surface 12A.

Figure 5:
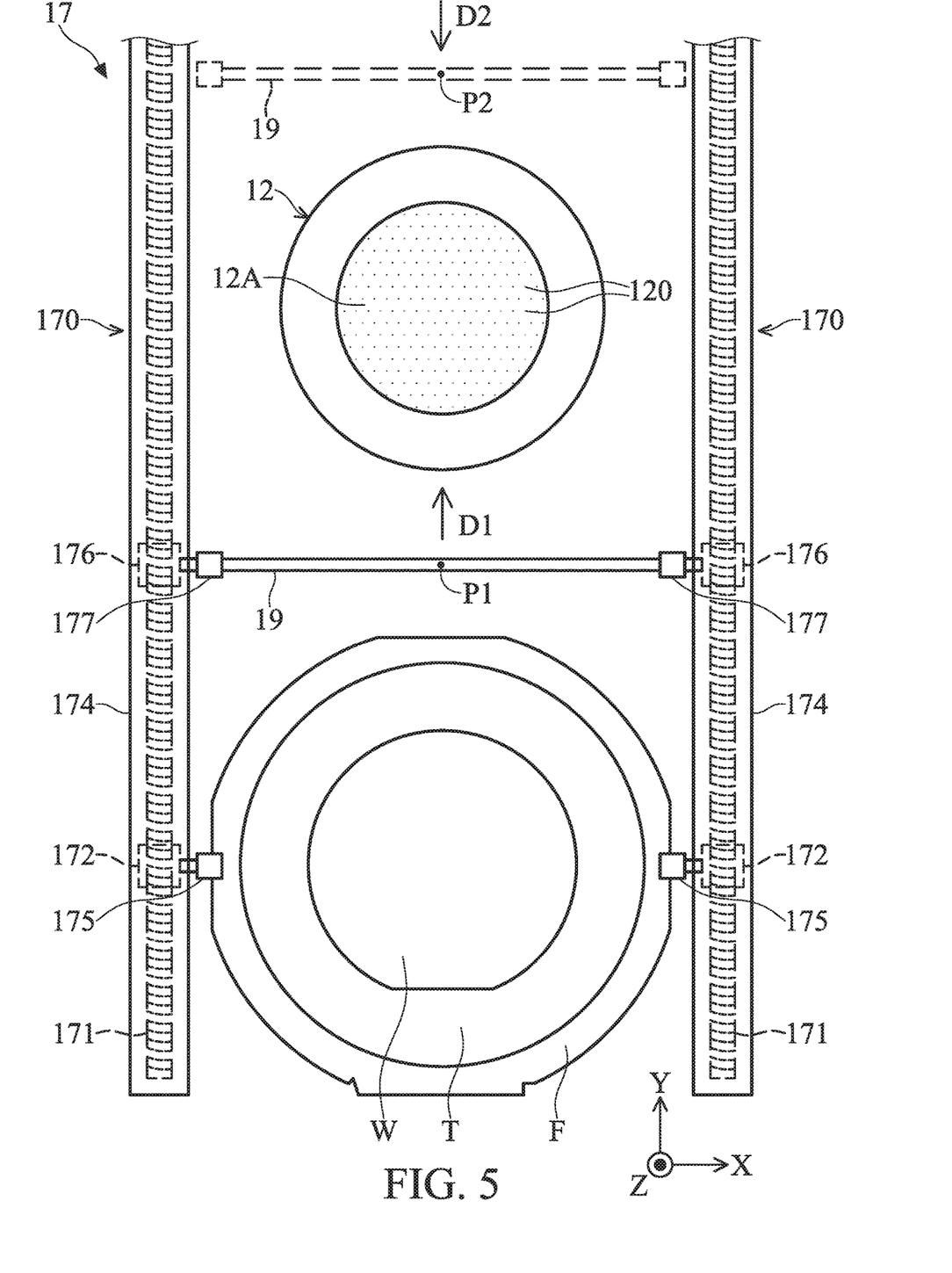
FIG. 5 schematically shows the relative position of a cleaning member, the chuck table, the workpiece-and-frame combination, and the transferring mechanism, in accordance with some embodiments.
Figure 6A:
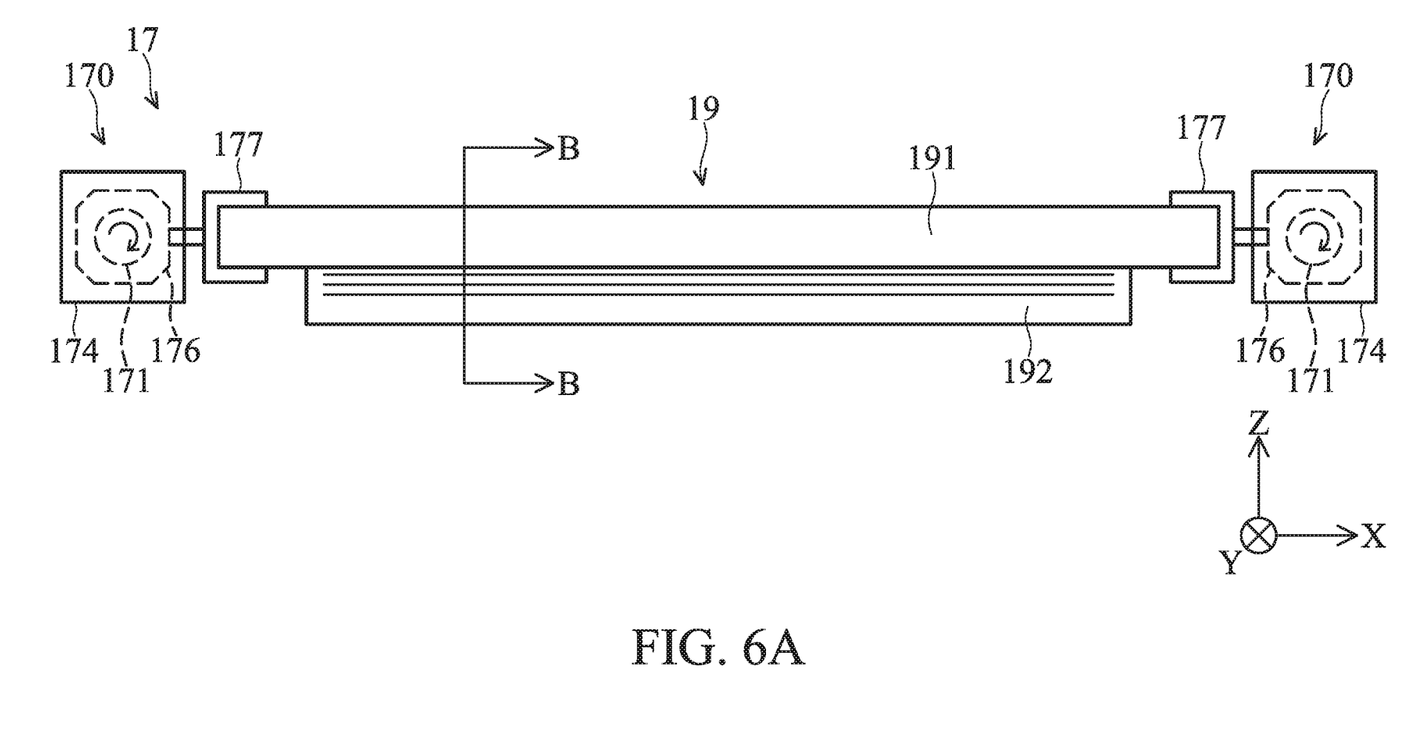
FIG. 6A is a side view of the cleaning member and the transferring mechanism in FIG. 5.

Referring to FIGS. 5 and 6A, in some embodiments, a cleaning member 19 is provided and connected to the transferring mechanism 17 (similar to the transferring mechanism 17 shown in FIGS. 3A and 3B), configured to move across and clean the chuck surface 12A via the drive of the transferring mechanism 17. As shown in FIGS. 5 and 6A, the cleaning member 19 is an elongated structure extended along a direction (e.g., the X-direction) substantially perpendicular to the extending direction of the linear driving assemblies 170 of the transferring mechanism 17 and the cleaning member 19 is disposed between the pair of linear driving assemblies 170.

The cleaning member 19 may include a base 191 and a scraper 192 that is removably mounted on the base 191. In particular, the scraper 192 mounted under the base 191 may protrude toward the chuck surface 12A (i.e., downward) and is extended in the X-direction to across the length (or diameter) of the (circular) chuck surface 12A. In some embodiments, the scraper 192 includes metal, ceramic or polymer material. In some embodiments, the scraper 192 is flexible. For example, the scraper 192 may be made of stainless steel and designed with a specific shape (for example, see FIG. 6B) to have a good elasticity, thereby having an increased strength while not causing damage to the chuck surface 12A when it contacts the chuck surface 12A. In some other embodiments, the scraper 192 may be designed with another optional shape.

To drive and position the cleaning member 19, at least one (e.g., one or both) of the linear driving assemblies 170 may each further include a (second) nut 176 that is coupled to the screw 171 and includes or is attached to a (second) gripper 177 for fixedly connecting and gripping one end of the cleaning member 19 (the base 191), as shown in FIGS. 5 and 6A. In some alternative embodiments, the housing 174 and the gripper 177 may also be omitted, and the nut 176 can be fixedly connected to the cleaning member 19, for example via adhesive or another optional mechanical fastener. Accordingly, at least one of the pair of linear driving assemblies 170 can be operated to drive the cleaning member 19, in the first direction D1 or second direction D2, to move across and clean the chuck surface 12A via the scraper 192. Since both the cleaning member 19 and the workpiece-and-frame combination are synchronously driven by the transferring mechanism 17, they move at the same speed and direction.

In some embodiments, the transferring mechanism 17 can be controlled by the controller 18 to drive the cleaning member 19 between an initial/first position P1 (in response to a workpiece-and-frame combination being at the position where it is initially loaded on the transferring mechanism 17 as shown in FIG. 5) and a final/second position P2 (in response to a workpiece-and-frame combination being at the position where it is directly over the chuck table 12), and the chuck table 12 is located between the first position P1 and the second position P2.

By this way, before a workpiece-and-frame combination is transferred to the chuck table 12 in the first direction D1, the cleaning member 19 can be driven by the transferring mechanism 17 to move across the chuck surface 12A in the first direction D1 (from the first position P1 to the second position P2) to clean the chuck surface 12A. After the workpiece-and-frame combination is transferred away from the chuck table 12 in the second direction D2, the cleaning member 19 can also be driven by the transferring mechanism 17 to move across the chuck surface 12A in the second direction D2 (from the second position P2 to the first position P1) to clean the chuck surface 12A again. Accordingly, for each workpiece, the cleaning member 19 can be driven by the transferring mechanism 17 (in two opposite directions) to clean the chuck table 12 twice, thereby improving the cleanliness of the chuck surface 12A during the cutting process. Thus, the yield rate of the cutting process is also improved.

Figure 7A:
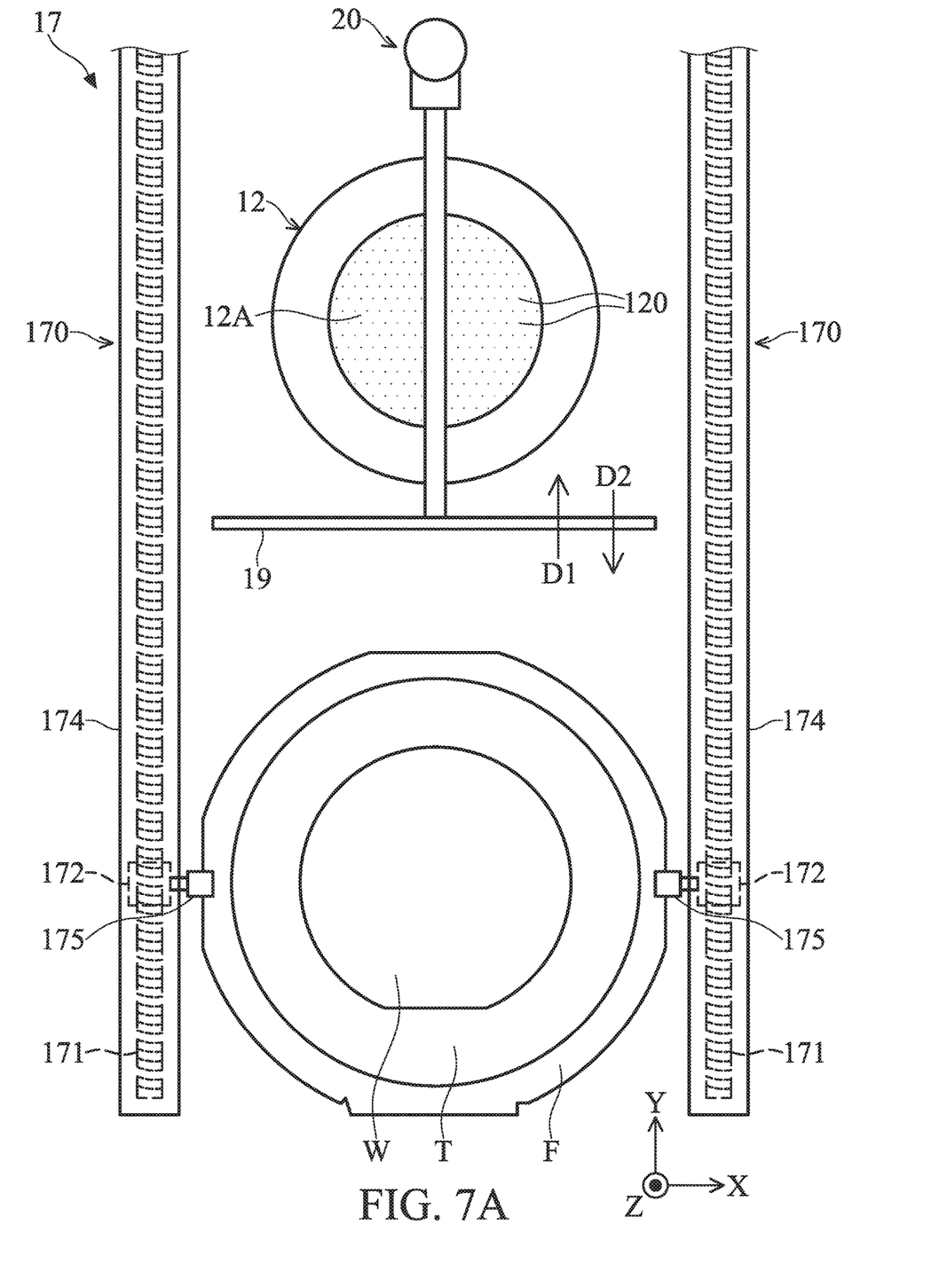
FIG. 7A schematically shows a driving mechanism for driving the cleaning member to move across and clean the chuck table, in accordance with some embodiments.

It should be appreciated that many variations and modifications can be made to embodiments of the disclosure. For example, in some other embodiments as shown in FIG. 7A, the cleaning member 19 is not connected to the transferring mechanism 17, and an independent driving mechanism 20 is provided in the processing chamber 11 (see FIG. 1) and connected to the cleaning member 19. The driving mechanism 20 is operable to drive the cleaning member 19 to move across and clean the chuck surface 12A of the chuck table 12. The driving mechanism 20 may be a robotic arm or the like, which can drive the cleaning member 19 at the same or different speed than the moving speed of a workpiece-and-frame combination driven by the transferring mechanism 17. The operation of the driving mechanism 20 can be controlled by the controller 18.

Similar to the embodiments of FIG. 5, for each workpiece, the cleaning member 19 can be driven by the driving mechanism 20 to clean the chuck table 12 twice (before a workpiece-and-frame combination is transferred to the chuck table 12 and after the workpiece-and-frame combination is transferred away from the chuck table 12), thereby improving the cleanliness of the chuck surface 12A during the cutting process. For example, as shown in FIG. 7A, before a workpiece-and-frame combination is transferred to the chuck table 12 by the transferring mechanism 17 in the first direction D1, the cleaning member 19 can be driven by the independent driving mechanism 20 to move across the chuck surface 12A in the first direction D1 to clean the chuck surface 12A. After the workpiece-and-frame combination is transferred away from the chuck table 12 by the transferring mechanism 17 in the second direction D2 (opposite to the first direction D1), the cleaning member 19 can also be driven by the independent driving mechanism 20 to move across the chuck surface 12A in the second direction D2 to clean the chuck surface 12A again. However, the moving direction and speed of the cleaning member 19 driven by the driving mechanism 20 can also be adjusted according to actual needs.

Figure 7B:
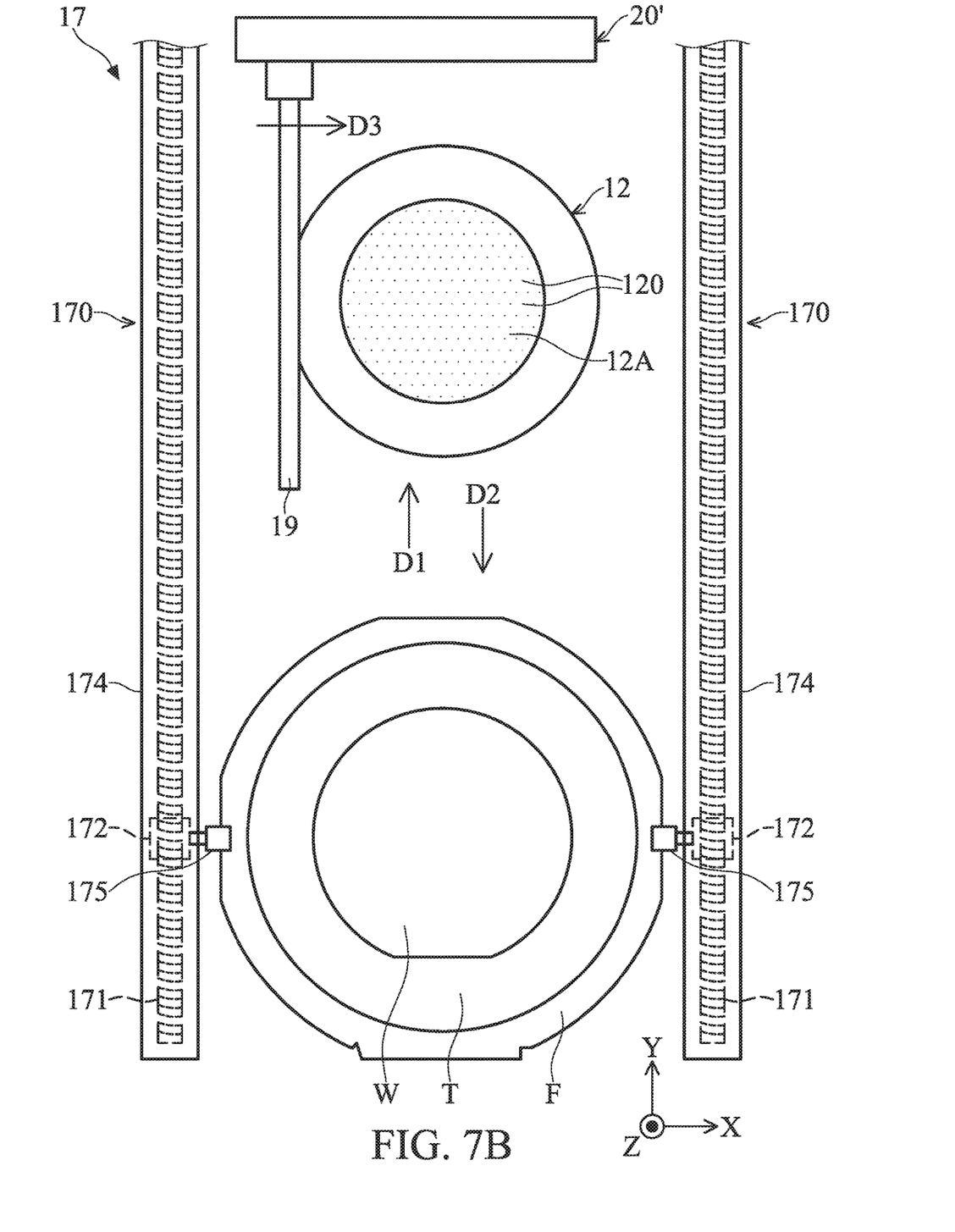
FIG. 7B schematically shows a driving mechanism for driving the cleaning member to move across and clean the chuck table, in accordance with some embodiments.

In some alternative embodiments as shown in FIG. 7B, an independent driving mechanism 20' is provided in the processing chamber 11 (see FIG. 1) and connected to the cleaning member 19. The driving mechanism 20' is operable to drive the cleaning member 19 to move across and clean the chuck surface 12A of the chuck table 12 in a direction D3 that is different from (such as perpendicular to) the moving direction D1 or D2 of a workpiece-and-frame combination driven by the transferring mechanism 17, before the workpiece-and-frame combination is transferred to the chuck table 12 and/or after the workpiece-and-frame combination is transferred away from the chuck table 12. Although not shown, the driving mechanism 20' can also drive the cleaning member 19 in a Z-direction, so as to avoid the cleaning member 19 interfering with the transportation of workpiece-and-frame combination. The operation of the driving mechanism 20' can be controlled by the controller 18. In the embodiments of FIG. 7B, the cleanliness of the chuck surface 12A during the cutting process is also improved using the cleaning member 19.

Although not shown, in some embodiments, the cleaning member 19 can also be controlled and driven in a swept manner to move across and clean the chuck surface 12A. In some embodiments, before the workpiece-and-frame combination is loaded into the processing chamber, the cleaning member 19 can also be driven, e.g., by the driving mechanism 20 or 20', to move across and clean the chuck surface 12A.

Figure 8:
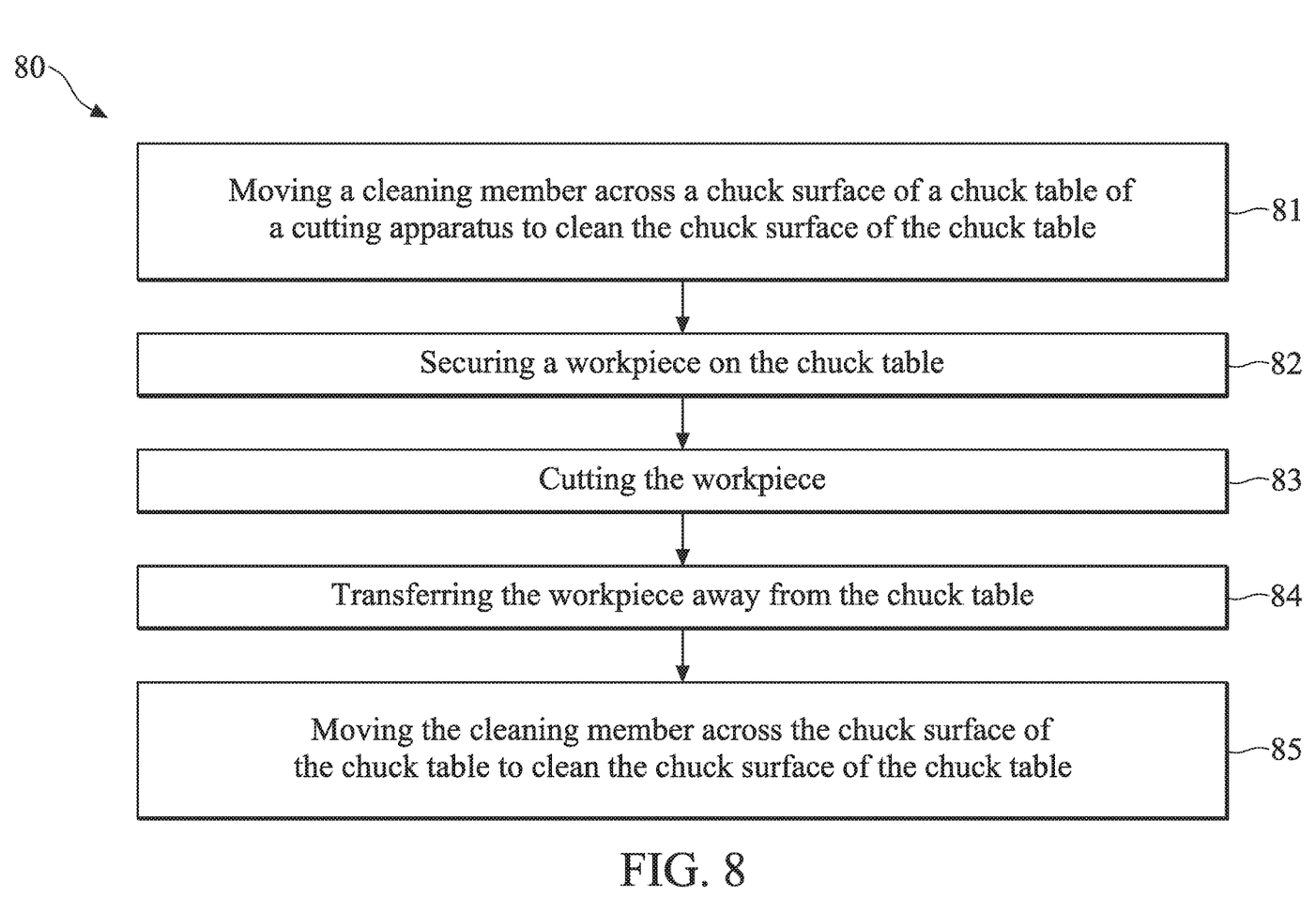
FIG. 8 is a simplified flowchart of a cutting method, in accordance with some embodiments.

Next, referring to FIG. 8, which is a simplified flowchart of a cutting method 80, in accordance with some embodiments. For illustration, the flow chart will be described along with the drawings shown in FIGS. 1-7B. Some of the described operations can be replaced or eliminated in different embodiments. Alternatively, some operations may be added in different embodiments. The cutting method 80 includes a number of operations, such as operations 81, 82, 83, 84, and 85.

In operation 81, a cleaning member 19 is moved across a chuck surface 12A of a chuck table 12 of a cutting apparatus 10 to clean the chuck surface 12A of the chuck table 12, as shown in FIGS. 5 to 7B. In some embodiments, the cleaning member 19 is moved across the chuck surface 12A of the chuck table 12 to clean the chuck surface 12A of the chuck table 12 before a workpiece W to be diced (described above) is transferred to the chuck table 12 for a cutting process.

Figure 6B:
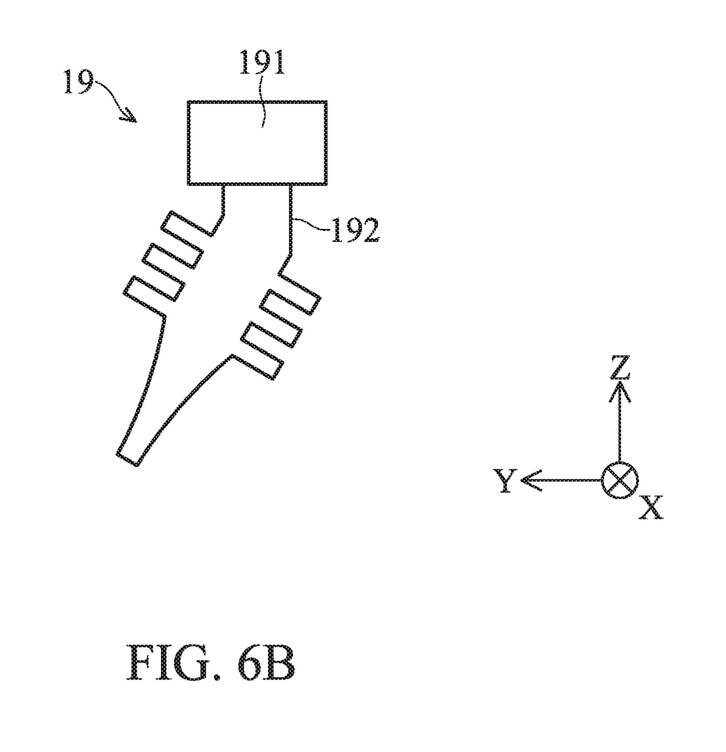
FIG. 6B is a cross-sectional view taken along line B-B in FIG. 6A.

In some embodiments, as shown in FIGS. 6A and 6B, the cleaning member 19 includes a scraper 192 configured to contact and clean the chuck surface 12A when the cleaning member 19 moves across the chuck table 12 (see FIG. 5). In some embodiments, the scraper 192 includes metal, ceramic or polymer material, and/or the scraper 192 is flexible.

In operation 82, after the chuck surface 12A of the chuck table 12 is cleaned by the cleaning member 19, a workpiece W to be diced is secured on the chuck table 12, as shown in FIG. 1. In some embodiments, a workpiece W (or a workpiece-and-frame combination) to be diced is loaded into the cutting apparatus 10 from a load port, and then transferred to the chuck table 12 (e.g., in a first direction D1 (FIG. 3B)) by a transferring mechanism 17 in the cutting apparatus 10 (see FIG. 1). The transferring mechanism 17 may include includes a pair of parallel linear driving assemblies 170 (see FIGS. 3A-3B) on opposite sides of the chuck table 12. Each linear driving assembly 170 may be a lead screw, a ball screw, or another type of linear driving assembly (e.g., a linear electromagnetic actuator). After the workpiece W is transferred to the chuck table 12, it can be secured on the chuck table 12 by, for example, vacuum force.

In operation 83, after the workpiece W is secured on the chuck table 12, a cutting process is performed on the workpiece W by the cutting apparatus 10 as described above. It should be appreciated that, since the cutting process is performed after cleaning the chuck surface 12A of the chuck table 12, it is possible to ensure that the chuck surface 12A has no debris or other foreign material remained thereon before the workpiece W is secured on the chuck surface 12A, thereby reducing the chance of workpiece damage due to the debris remained on the chuck surface 12A.

In some embodiments, before the workpiece W (or the workpiece-and-frame combination) to be diced is transferred to the chuck table 12, the cleaning member 19 is moved, across the chuck surface 12A of the chuck table 12 to clean the chuck surface 12A, by the transferring mechanism 17 that is configured to transfer the workpiece W (or the workpiece-and-frame combination). In some alternative embodiments, before the workpiece W (or the workpiece-and-frame combination) to be diced is transferred to the chuck table 12, the cleaning member 19 is moved, across the chuck surface 12A of the chuck table 12 to clean the chuck surface 12A, by another independent driving mechanism 20 or 20' (see FIG. 7A or 7B) provided in the processing chamber 11. In some embodiments, the moving of the cleaning member 19 and the transferring of the workpiece W are at different speeds or the same speed. In some embodiments, the moving direction of the cleaning member 19 and the transferring direction of the workpiece W can be different or the same.

In operation 84, the workpiece W is transferred away from the chuck table 12 after the cutting process. In some embodiments, as shown in FIG. 5, the workpiece W (or the workpiece-and-frame combination) is transferred by the pair of parallel linear driving assemblies 170 of the transferring mechanism 17 in a second direction D2 (see FIG. 3B), opposite to the first direction D1, away from the chuck table 12 (e.g., to a cassette stay at the load port of the cutting apparatus 10) after the cutting process.

In operation 85, after the workpiece W is transferred away from the chuck table 12, the cleaning member 19 is also moved across the chuck surface 12A of the chuck table 12 to clean the chuck surface 12A. In some embodiments as shown in FIG. 5, after the workpiece W (the workpiece-and-frame combination) is transferred by transferring mechanism 17 away from the chuck table 12 (in the second direction D2), the transferring mechanism 17 can drive the cleaning member 19 with a scraper 192 in the second direction D2 to move across the chuck surface 12A of the chuck table 12 to clean the chuck surface 12A. In some alternative embodiments as shown in FIGS. 7A-7B, after the workpiece W (the workpiece-and-frame combination) is transferred by transferring mechanism 17 away from the chuck table 12 (in the second direction D2), another independent driving mechanism 20 or 20' provided in the cutting apparatus 10 can drive the cleaning member 19 with a scraper 192 to move across the chuck surface 12A of the chuck table 12 to clean the chuck surface 12A. In various embodiments, the moving direction and speed of the cleaning member 19 driven by the driving mechanism 20 or 20' may be the same or different from the transferring direction and speed of the workpiece W driven by the transferring mechanism 17.

Accordingly, for each workpiece, the cleaning member 19 in the processing chamber 11 can be moved across the chuck surface 12A of the chuck table 12 to clean the chuck surface 12A twice, thereby improving the cleanliness of the chuck surface 12A during the cutting process. Thus, the yield rate of the cutting process is also improved.

The embodiments of the present disclosure have some advantageous features: By introducing auto cleaning mechanisms into the processing chamber to clean the chuck surface of the chuck table (e.g., before the cutting process, after the cutting process, or both (note that the cutting apparatus is not "shut down" during cleaning of the chuck table)), the cleanliness of the chuck surface during the cutting process can be improved, so that the chance of workpiece damage (such as internal stress on the workpiece or cracks in the workpiece) due to the debris on the chuck surface is reduced. Moreover, the yield rate of the cutting process is also improved.

In some embodiments, a cutting apparatus is provided. The cutting apparatus includes a processing chamber, a chuck table, a transferring mechanism, and a cleaning member. The chuck table is disposed in the processing chamber and configured to hold a workpiece on a chuck surface of the chuck table during a cutting process. The transferring mechanism is configured to transfer the workpiece to the chuck surface before the cutting process or transfer the workpiece away from the chuck surface after the cutting process. The cleaning member is disposed in the processing chamber, and is configured to move across and clean the chuck surface, driven by the transferring mechanism.

In some embodiments, a cutting apparatus is provided. The cutting apparatus includes a processing chamber, a chuck table, a transferring mechanism, and a cleaning member. The chuck table is disposed in the processing chamber and configured to hold a workpiece on a chuck surface of the chuck table during a cutting process. The transferring mechanism is configured to transfer the workpiece to the chuck surface before the cutting process or transfer the workpiece away from the chuck surface after the cutting process. The cleaning member is disposed in the processing chamber, wherein the cleaning member is configured to move across the chuck surface in a first direction, driven by the transferring mechanism, to clean the chuck surface; and the cleaning member is configured to move across the chuck surface in a second direction, driven by the transferring mechanism, to clean the chuck surface, the second direction being opposite to the first direction In some embodiments, a cutting method is provided. The cutting method includes transferring a workpiece to a chuck table of a cutting apparatus with a transferring mechanism. The cutting method also includes moving a cleaning member, driven by the transferring mechanism, across a chuck surface of the chuck table to clean the chuck surface, before transferring the workpiece to the chuck table. The cutting method further includes performing a cutting process on the workpiece secured on the chuck table. The cutting method further includes transferring the workpiece away from the chuck table with the transferring mechanism, after the cutting process. In addition, the cutting method includes moving the cleaning member, driven by the transferring mechanism, across the chuck surface of the chuck table to clean the chuck surface again, after transferring the workpiece away from the chuck table.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A cutting apparatus, comprising:
   a processing chamber;
   a chuck table disposed in the processing chamber and configured to hold a workpiece on a chuck surface of the chuck table during a cutting process;
   a cutting blade positioned in the processing chamber and configured to perform a cutting process on the workpiece while the workpiece is on the chuck surface;
   a transferring mechanism configured to transfer the workpiece to the chuck surface before the cutting process or transfer the workpiece away from the chuck surface after the cutting process; and
   a cleaning member disposed in the processing chamber, wherein the cleaning member is configured to move across and clean the chuck surface, driven by the transferring mechanism.

2. The cutting apparatus as claimed in claim 1, wherein the cleaning member is driven by the transferring mechanism between a first position and a second position, and the chuck table is located between the first position and the second position.

3. The cutting apparatus as claimed in claim 1, wherein the transferring mechanism comprises a pair of driving assemblies on opposite sides of the chuck table, and at least one of the pair of driving assemblies is configured to drive the cleaning member in a first direction to move across the chuck surface of the chuck table.

4. The cutting apparatus as claimed in claim 3, wherein the cleaning member is disposed between the pair of driving assemblies and extended in a second direction to across a length of the chuck surface, the second direction being different from the first direction.

5. The cutting apparatus as claimed in claim 3, wherein the at least one of the pair of driving assemblies comprises a gripper to connect and grip the cleaning member.

6. The cutting apparatus as claimed in claim 3, wherein each of the driving assemblies comprises a lead screw, a ball screw, or electromagnetic actuator.

7. The cutting apparatus as claimed in claim 1, wherein the cleaning member comprises a scraper configured to contact and clean the chuck surface, wherein the scraper comprises metal, ceramic or polymer material.

8. The cutting apparatus as claimed in claim 1, wherein the cleaning member is configured to move across and clean the chuck surface, driven by the transferring mechanism, while the workpiece is not on the chuck surface.

9. The cutting apparatus as claimed in claim 1, wherein the workpiece and the cleaning member are synchronously driven by the transferring mechanism.

10. A cutting apparatus, comprising:
    a processing chamber;
    a chuck table disposed in the processing chamber and configured to hold a workpiece on a chuck surface of the chuck table during a cutting process;
    a cutting blade positioned in the processing chamber and configured to perform a cutting process on the workpiece while the workpiece is on the chuck surface;
    a transferring mechanism configured to transfer the workpiece to the chuck surface before the cutting process or transfer the workpiece away from the chuck surface after the cutting process; and
    a cleaning member disposed in the processing chamber, wherein the cleaning member is configured to:
      move across the chuck surface in a first direction, driven by the transferring mechanism, to clean the chuck surface; and
      move across the chuck surface in a second direction, driven by the transferring mechanism, to clean the chuck surface, the second direction being opposite to the first direction.

11. The cutting apparatus as claimed in claim 10, wherein the workpiece and the cleaning member are synchronously driven by the transferring mechanism.

12. The cutting apparatus as claimed in claim 11, wherein the workpiece and the cleaning member move at the same speed and direction, driven by the transferring mechanism.

13. The cutting apparatus as claimed in claim 10, wherein the cleaning member is configured to move across and clean the chuck surface, driven by the transferring mechanism, while the workpiece is not on the chuck surface.

14. The cutting apparatus as claimed in claim 10, wherein the transferring mechanism comprises a pair of driving assemblies on opposite sides of the chuck table and extended in a direction parallel to the first direction and the second direction, configured to drive the cleaning member or transfer the workpiece.

15. The cutting apparatus as claimed in claim 14, wherein the cleaning member is disposed between the pair of driving assemblies and extended in a direction to across a length of the chuck surface, wherein the extension direction of the cleaning member is perpendicular to the first direction and the second direction.

16. A cutting method, comprising:
- transferring a workpiece to a chuck table of a cutting apparatus with a transferring mechanism;
- moving a cleaning member, driven by the transferring mechanism, across a chuck surface of the chuck table to clean the chuck surface, before transferring the workpiece to the chuck table;
- using a cutting blade to perform a cutting process on the workpiece secured on the chuck table;
- transferring the workpiece away from the chuck table with the transferring mechanism, after the cutting process; and
- moving the cleaning member, driven by the transferring mechanism, across the chuck surface of the chuck table to clean the chuck surface again, after transferring the workpiece away from the chuck table.

17. The cutting method as claimed in claim 16, wherein the workpiece and the cleaning member are synchronously driven by the transferring mechanism.

18. The cutting method as claimed in claim 17, wherein the workpiece and the cleaning member move at the same speed and direction, driven by the transferring mechanism.

19. The cutting method as claimed in claim 16, wherein the cleaning member is driven in a first direction to clean the chuck surface before the cutting process, and the cleaning member is driven in a second direction to clean the chuck surface after the cutting process, the second direction being opposite to the first direction.

20. The cutting method as claimed in claim 19, wherein the workpiece is transferred to the chuck table in the first direction before the cutting process, and the workpiece is transferred away from the chuck table in the second direction after the cutting process.

\* \* \* \* \*